United States Patent [19]

DePillo

[11] 4,011,504
[45] Mar. 8, 1977

[54] SOLID STATE SCALE EXPANDING CIRCUIT FOR ELECTRICAL INDICATOR DEVICES

[76] Inventor: Lawrence V. DePillo, 11 Steuben St., Waterbury, Conn. 06708

[22] Filed: June 12, 1975

[21] Appl. No.: 586,507

[52] U.S. Cl. .............................. 324/115; 324/132; 328/143
[51] Int. Cl.² .................. G01R 15/08; G01R 15/10
[58] Field of Search .......... 324/115, 131, 130, 132; 328/143; 307/229, 230

[56] References Cited
UNITED STATES PATENTS

| 3,125,718 | 3/1964 | Race | 324/131 |
| 3,268,813 | 8/1966 | Pendleton | 324/132 |
| 3,273,060 | 9/1966 | Schneider | 324/131 |
| 3,644,836 | 2/1972 | Johnson | 328/143 |
| 3,778,710 | 12/1973 | Snook | 324/130 |

*Primary Examiner*—Rudolph V. Rolinec
*Assistant Examiner*—Ernest F. Karlsen
*Attorney, Agent, or Firm*—H. Gibner Lehmann; K. Gibner Lehmann

[57] ABSTRACT

A scale modifying circuit for providing either expanded or compressed scale readings on a conventional electrical indicating instrument. The device includes a pair of input terminals adapted to be connected to a source of voltage to be monitored or measured, a voltage responsive network connected with one of said input terminals for supplying output voltage to output terminals of the device, and amplifier means driven from the input terminals and having an output connected to supply a driving voltage to at least one of the output terminals. Expanded scales (or compressed scales) can be provided at the lower, middle, or high end of a particular range of voltages being monitored, or at intermediate points. This results in higher resolution over the expanded scale portion, together with improved accuracy. An illustrated embodiment of the invention embraces a voltage-limiting diode, to effect a cut-off of an ascending applied voltage. Some embodiments involve cascaded and summing amplifiers, negative feedback circuits, and multi-coil instrument movements where the coils are involved with the feedback.

15 Claims, 6 Drawing Figures

SOLID STATE SCALE EXPANDING CIRCUIT FOR ELECTRICAL INDICATOR DEVICES

BACKGROUND

This invention relates generally to expanded and compressed scale measuring devices, and more particularly to instrumentation which includes electronic circuits for supplying output voltages having the necessary expanded/contracted incremental characteristics for directly driving an inexpensive conventional instrument movement such as a milliammeter or galvanometer.

In the past, a number of techniques have been employed for obtaining expanded scale readings over predetermined subranges within a larger measurement range, in order to achieve increased accuracy and resolution. Prior devices have involved meter movements including tailored pole pieces, tapered cores, or special magnets whereby magnetic field gradients of unique character were produced within the air gap in which the field coil was movable. In such devices, equal increments of current would produce different deflections depending upon the rotary position of the coil within the air gap.

While such movements operated in an acceptable fashion, there were a number of distinct drawbacks which became apparent. The manufacture of tapered pole pieces is both costly and difficult to control. As a result, substantial variation was encountered between different units of the same type. In addition, it was found that such instruments were somewhat unstable in that the exact points of expansion and/or contraction were extremely difficult to control. In manufacturing runs of 50 or 100 instruments, considerable variation was found to occur from unit to unit. Attempts to calibrate each completed instrument separately helped to overcome the above disadvantages, but resulted in increased assembly time and higher overall cost. In addition, such movements employed no negative feedback, and were thus susceptible to somewhat greater inaccuracy than other devices employing feedback.

Still other systems involved servo feedback loops employing servo motors driving non-linear potentiometers through suitable gear trains and the like. Typically, the indicator was connected to be driven through the same gear train as that which drove the potentiometer. Negative feedback was provided from the potentiometer to the input of the amplifier which powered the servo. Depending upon the nature of the non-linear potentiometer, equal voltage increments over the range being measured or monitored resulted in unequal increments of feedback voltage derived from the potentiometer, thus resulting in non-linear scale readings. Problems were encountered with such systems, in that there was a tendency for the devices to "hunt" about a quiescent point, this resulting in objectionable noise and minute oscillating movements of the servo motor and gears. In addition, the gear trains were generally complex, noisy, and expensive to manufacture and maintain. Some variation was usually encountered between the non-linear potentiometers from unit to unit, this resulting in slight variations in calibration from one device to the next.

Still other systems involved non-linear amplifiers which employed a multiplicity of switching diodes in a feedback loop around the amplifier. The arrangement was such that as the output of the amplifier attained different values, successive diodes were rendered conductive, thus altering the net closed loop gain of the amplifier and resulting in expanded or contracted readings within part of the range of signals being monitored. One device of this type is known as a logarithmic amplifier, which provides an output voltage proportional to the log of the input voltage. Such amplifiers have wide application in the field of spectrum analysis, where logarithmic scales are employed for the vertical axis on a cathode ray tube. These amplifiers generally operated in a satisfactory manner, but employed a number of variable resistors in series with the switching diodes in order to enable variation in the cut-in point of each diode to be achieved. In addition, problems were frequently encountered with temperature drift of the diodes, wherein the switch-on voltage typically varied by one or two millivolts per degree centigrade of temperature change. Moreover, it has been found to be difficult to effectively compensate for this drift in such amplifiers.

SUMMARY

The above disadvantages and drawbacks of prior expanded scale instruments are obviated by the present invention which has for an object the provision of improved indicating instrumentation including a solid state, scale-expanding/compressing circuit for use with conventional electrical instrument movements, which is flexible in its application, extremely simple in construction, reliable in operation, and which uses readily available components. A related object is the provision of a device as above, wherein the overall accuracy and resolution of the modified scale readings is greatly enhanced. Yet another object of the invention is the provision of a scale modifying circuit for use with conventional electrical movements, wherein the portion of the scale which is expanded or contracted can be readily modified without resorting to extensive rewiring, component changes, etc.

The above objects are accomplished in a preferred embodiment of the invention by the provision of instrumentation including a solid state scale modifying circuit, comprising a pair of input terminals adapted to be connected to a source of voltage to be monitored or measured, an electrical voltage responsive branch network connected to one of the said input terminals and being adapted to supply voltages to output terminals of the device in response to application of different input voltages to the network from the source being measured, a second branch circuit comprising amplifying means connected with the input terminals to respond to voltages thereon and to supply a driving voltage to at least one of the output terminals, together with means associated with the amplifying means for limiting the response of the latter to a predetermined portion only of the entire range of input voltage. The arrangement is such that the output or instrument-movement feeder terminals of the device receive continuous incremental contributions from the voltage responsive network, while the amplifying means supplies incremental contributions for only limited times corresponding to the application of input voltages within a predetermined portion of the input range. The summation from the voltage responsive network and the amplifying means can be connected to the indicator device in such a way as to be additive (or subtractive), thereby providing the expanded (or contracted) readings. During such time as the amplifying means is disabled, as for example, when the input voltage is either below a predetermined value or above a second predetermined value, incremental contributions to the output voltage on the output terminals are confined solely to those resulting from the voltage responsive network. In one embodiment, the network comprises resistances connected between the input and output terminals, merely providing an attenuation of the input voltage. In another embodiment of the invention, the network comprises an amplifier having a gain and operating point enabling it to remain active throughout the entire range of input voltage being measured. By such an arrangement, this amplifier provides drive to the output terminals at all times, while the amplifying means selectively provides additive incremental drive over a predetermined subrange within the range being measured, so as to produce expanded (or contracted) scale readings on the indicator.

Other features and advantages will hereinafter appear.

In the drawings, illustrating several embodiments of the invention:

Figure 1:
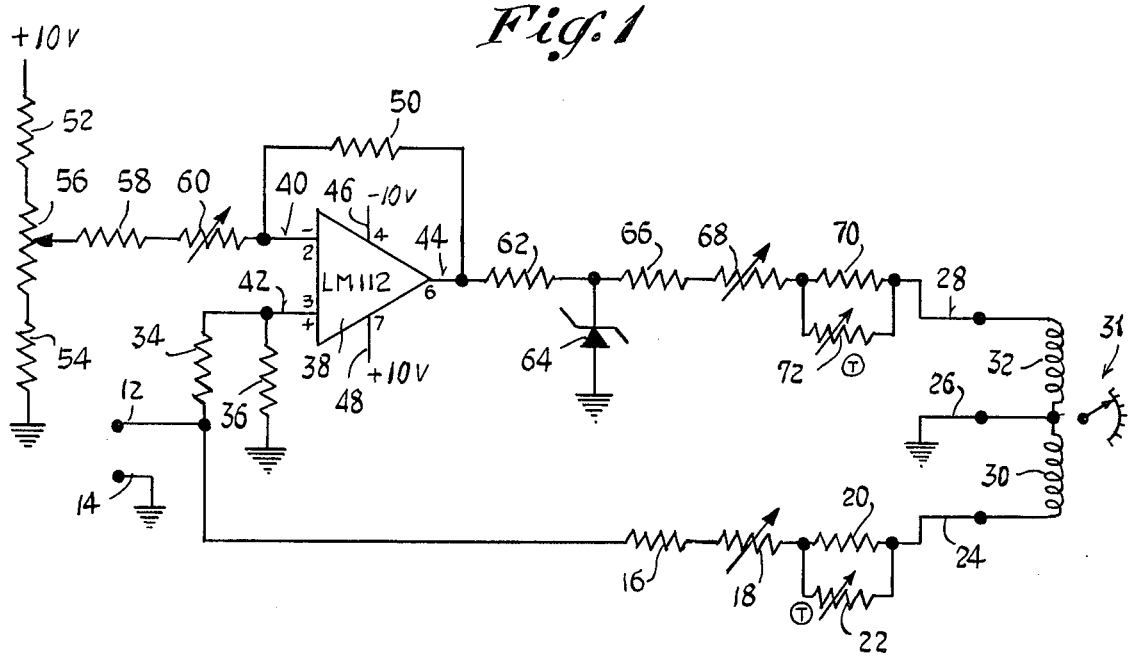
FIG. 1 is a schematic circuit diagram of one embodiment of the present invention, comprising a scale expanding circuit connected to an indicating device such as a milliammeter.

Referring first to FIG. 1 and in accordance with the present invention there is provided a novel and improved scale expanding circuit for use with an electrical indicator, for providing expanded readings of a voltage being measured or monitored. The circuit includes a pair of input terminals or leads 12, 14 adapted to be connected to a source of voltage being measured, typically on the order of a fraction of a volt. In the present context and in the appended claims, the term "terminal" is intended to mean a conductor or lead carrying a signal or current. Connected to the input lead 12 is an electrical voltage responsive network constituting one voltage-contributing branch and comprising resistors 16, 18, 20 and a thermistor 22, extending to an output or feeder terminal 24 of the device. Additional output or feeder terminals 26, 28 are provided, adapted to be connected to the terminals of an electrical indicating device or meter comprising or instrument movement 31 having two field coils. The coil are illustrated in FIG. 1, and designated by the numerals 30, 32. As shown, one lead of each coil is common, and connected to the device output terminal or lead 26.

Also extending from the input lead 12 is a voltage divider comprising resistors 34, 36, which are connected to the input of an amplifying means 38 which constitutes another voltage contributing branch of the present device. The latter includes inverting and non-inverting inputs 40, 42 respectively, an output 44, and supply leads 46, 48 extending to plus and minus 10 volts d.c. The amplifying means further includes input resistors 58, 60. Negative feedback is provided by resistor 50. Bias voltage for the iverting input 40 is obtained from a voltage divider consisting of resistors 52, 54 and potentiometer 56. These resistors 52-60 and feedback resistor 50 determine the gain of the amplifying means 48.

Extending from the output 44 is a current limiting resistor 62 and a zener diode 64. Additional resistors 66, 68 are chosen to provide the desired current for meter coil 32. A thermistor 72 compensates for changes in the resistance of the coil 32 with temperature, and resistor 70 is a shunt employed with the device.

In operation, an input voltage applied between the terminals or leads 12, 14 results in current flow through the resistors 16, 18, 20 and meter coil 30. This tends to produce a predetemined deflection on the meter, which in the case of a linear instrument, would be directly proportional to the magnitude of the voltage applied between the terminals 12 and 14. In connection with the amplifying means 38, the zener 64 and divider string 52-56 limit its response to a predetermined range of input voltages, whereby the amplifying means provides an incremental contribution to the meter reading (through the coil 32) only during such time as the input voltage lies within said lower predetermined range. Typically the voltage gain of the amplifying means 38 can be on the order of several hundred, and the resistor 56 is set such that it is biased off for the lower portion of the input voltage range being monitored. As the input voltage increases, gradually a point is reached wherein the voltage applied to terminal 42 of the amplifying means approaches the voltage on terminal 40 determined by the setting of the biasing resistor 56. At such time, the output 44 of the amplifying means begins to increase (at a fast rate, due to the high gain of the stage), thus causing current to flow through the resistors 62-70 and through the coil 32 of the meter. Thus, there is provided an additional contribution to the meter reading through coil 32, from this amplifying means while it is operating within its active range. Continued increase in the level of the input signal or voltage will eventually cause the output voltage of the amplifying means to increase to a point wherein the zener voltage is reached, after which further increases in the output of the amplifier will result in negligible additional current contribution to the coil 32. Input voltages beyond that which causes the zener to conduct will clearly not result in any significant additional contribution to the current flowing through the meter coil 32. Accordingly, additional increases in the input voltage will result in increases in the meter reading, solely from current flowing through the voltage responsive network comprising resistors 16-20 to the coil 30. By such an arrangement, the meter 31 receives contributions from both the network and the amplifying means for input voltages lying within a central portion of the entire input range; voltages outside this portion result in incremental contributions to the output through the network only. It can be readily seen that the amount of expansion depends in part upon the gain of the amplifying means as determined by the resistors 50–60. In addition, by substituting a different zener diode 64, it is possible to change the point at which the expanded scale operation terminates. By adjusting the potentiometer 56, it is possible to set the point on the input voltage range at which expanded scale operation commences.

From the above, it will be understood that as the input voltage applied to terminals 12, 14 passes from the low end of its range into the middle of its range (or into that portion over the range where the circuit is set to provide expanded readings), the ratio of output to input voltage will change. That is, for a given ramp voltage or excursion of say 500 millivolts, positive going at the input, the excursion at the output terminal will show two or three zones of different incremental characteristics, whereby the ratio of output voltage to input voltage will be different in the expanded range from that in the non-expanded range. For example, an excursion of from 50 to 100 millivolts d.c. at the input might yield an output excursion of from 15 to 30 circular degrees on scale 31 corresponding to an output voltage excursion of from 300 to 600 millivolts d.c., while an equal excursion of from 200 to 250 millivolts d.c. at the input could typically yield an (expanded) output excursion of from 60 to 125 circular degrees on scale 31, corresponding to an output voltage excursion of from 1200 to 2500 millivolts d.c., assuming the 200 to 250 millivolt input excursion was within the input voltage range corresponding to expanded scale operation. Accordingly, the amount of expansion realized in such an arrangement would be 1300 millivolts/300 millivolts or 4.33 to 1. As a consequence, an extremely flexible instrument results, all without reliance on gears, servo motors, and the like.

Figure 2:
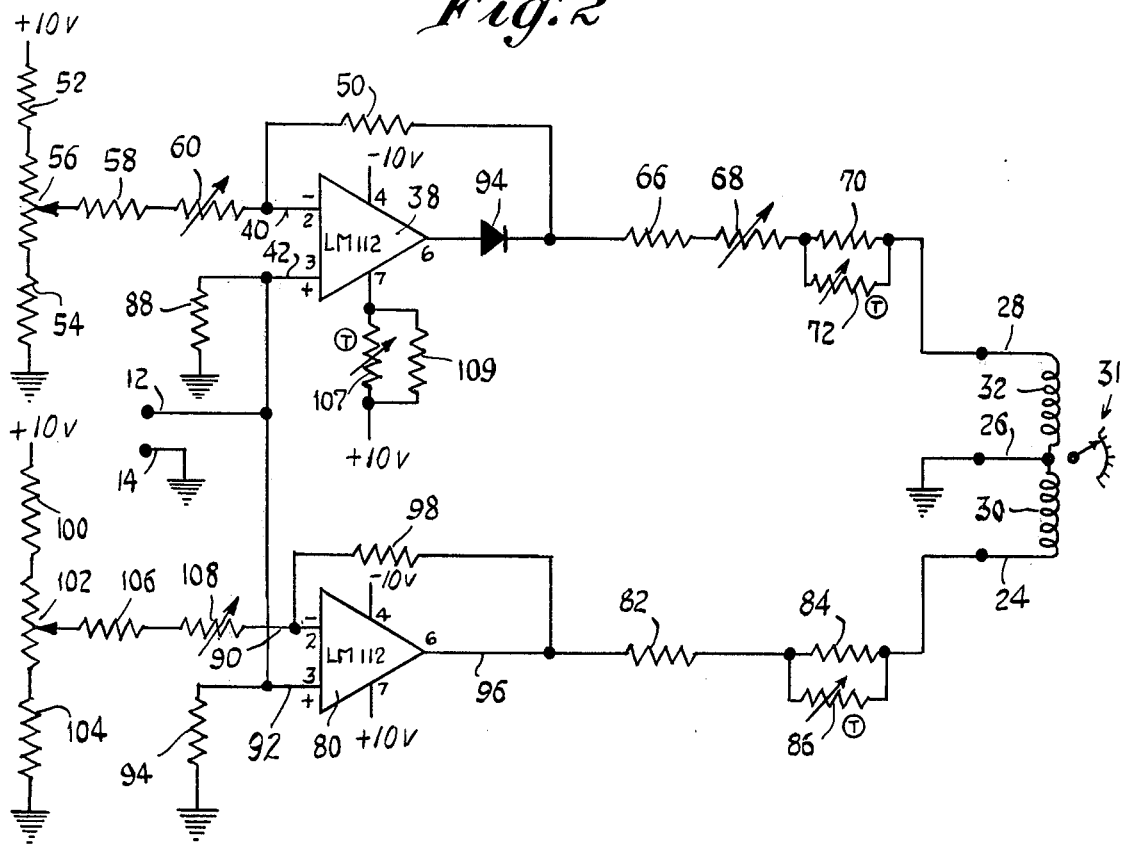
FIG. 2 is a schematic circuit diagram of another embodiment of the invention, showing additive output voltages contributed from both an amplifying means and a voltage responsive network in the form of an amplifier.

Another embodiment of the invention is illustrated in FIG. 2, wherein like reference numerals designate similar components. The circuit of FIG. 2 is similar to that of FIG. 1, except that the resistors 16–18 have been eliminated and replaced with an amplifier 80 having an output resistor 82. As in the previous embodiment, the scale expanding circuit comprises input terminals 12, 14, terminal 12 extending to the non-inverting input 42 of the amplifying means 38. A biasing resistor 88 extends from this input to ground in order to set the operating point of this stage in the absence of an input signal or voltage.

As shown, the amplifier 80 includes inverting and non-inverting inputs 90, 92 respectively, the latter having a biasing resistor 94 to ground. Negative feedback is taken from the output terminal 96 through resistor 98, to the inverting input 90. Bias for this input 90 is obtained from a voltage divider including resistors 100, 104, and potentiometer 102. Resistors 100–108, together with resistor 98 determine the gain of the amplifier 80. The operation of this embodiment is similar to that of the first embodiment, except that the signal appearing between terminals 12 and 14 is amplified by the amplifier 80, which in turn drives the meter coil 30 through the resistor 82. The thermistor 86, including a shunt 84, provides temperature compensation for the coil 30 of the meter 31.

In normal operation, the amplifier 80 is active and operating in its linear range over substantially the entire range of input voltages adapted to be impressed across terminals 12, 14, and the amplifying means (amplifier 38) is normally biased off by the voltage divider consisting of resistors 52–56. Assuming a low level d.c. signal is applied to the terminal 12, this will be amplified in the stage 80, which in turn will result in a small current through the meter coil 30, causing a low level reading on the meter scale 31. For such low input level signals, no incremental contribution is made to the meter reading by the amplifying means 38 by virtue of the fact that the latter is biased off. Assuming now that the input signal increases somewhat, a point will be reached wherein the amplifying means 38 becomes activated, which in turn will result in current flowing through resistors 66–68 to coil 32. Accordingly, for such mid-range voltages, incremental current contributions will be received at both the coils 30, 32. Due to the fact that the gain of the amplifying means 38 is set up to be greater than that of the amplifier 80, the amplifying means 38 will rapidly be driven into saturation as the magnitude of the d.c. level on line 12 increases. After saturation, further increases in the signal level on lead 12 will clearly not result in any further incremental contributions through the meter coil 32. Accordingly, such increases will be reflected by increased current through the coil 30 only. In this way, the center portion on the scale 31 will provide expanded, readings, with the points at which expansion begins and ends respectively being determined by the settings of resistors 56 and 60. Also, an additional thermistor is provided, designated by the numeral 107, and including a shunt resistor 109, for alterning the positive supply voltage to the amplifying means 38 with temperature, which has the effect of maintaining the saturation voltage of the amplifying means 38 constant. This provides a uniform point for termination of expanded scale operation and has been found to be a desirable feature to retain. It is also noted that an isolation means or diode 94 is provided within the feedback loop of the amplifying means 38, the diode effectively disconnecting the amplifying means 38 from the resistor 66 (and coil 32) during such time that the amplifying means is biased completely off. Without such a diode, the negative voltage appearing on the output lead of the amplifying means 38 would adversely effect the meter reading during the time at which the latter is supposed to be controlled entirely by the current received by coil 30 from amplifier 80. The diode may be replaced by an optical isolator, or other undirectional component or circuit for effecting isolation of the output terminal of the amplifying means.

Figure 3:
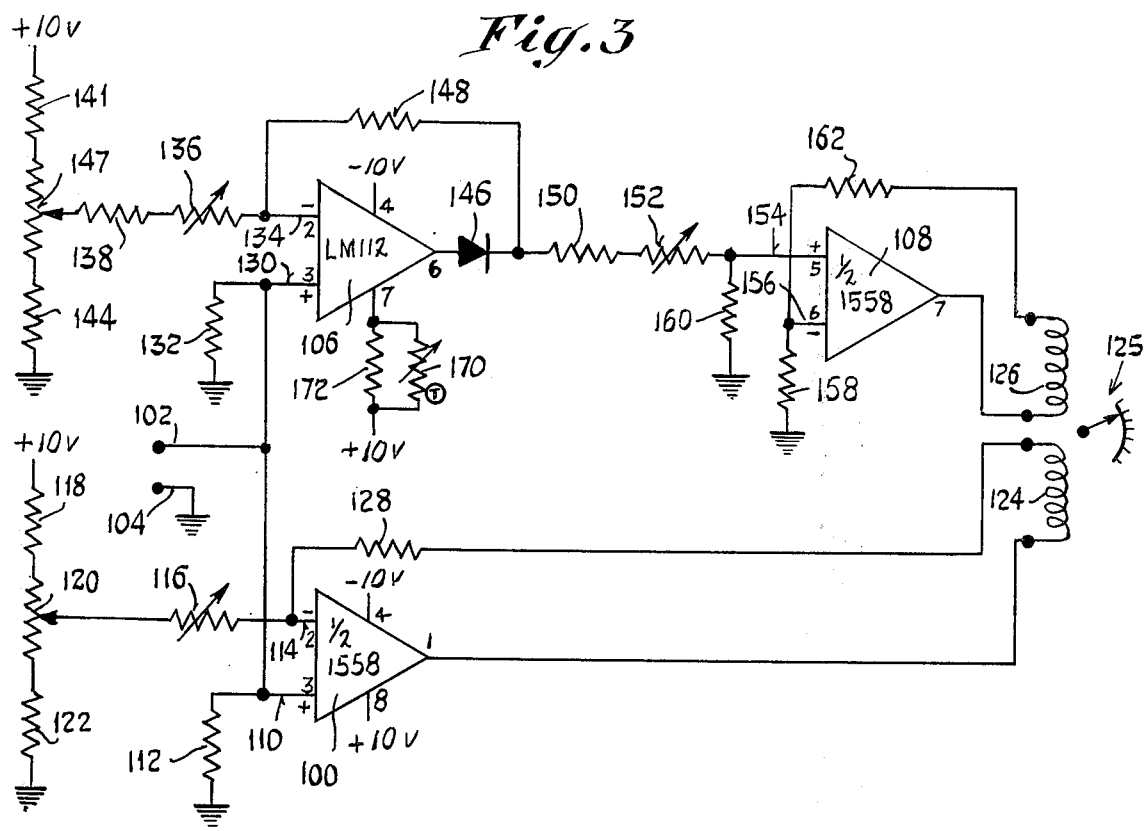
FIG. 3 is a schematic circuit diagram of still another embodiment of the invention, wherein four output terminals are provided for connection respectively to two separate field coils of an instrument movement.

Another embodiment of the invention is illustrated in FIG. 3, showing a signal processing network or voltage responsive network comprising an amplifier 100 connected to receive a voltage to be measured or monitored on terminals 102, 104, together with amplifying means comprising two amplifiers 106, 108 connected in cascade with one another. As shown, the amplifier 100 has a non-inverting input 110 from which there extends a biasing resistor 112 to ground. The input 110 is connected directly to the terminal 102. The inverting input 114 extends through a variable resistor 116 to a voltage divider consisting of resistors 118, 122, and potentiometer 120. An indicating device in the form of a milliameter or instrument movement with scale 125 is provided, including two independent field coils 124, 126. As shown, the coil 124 constitutes part of the feedback resistance for the amplifier 100, the other part being the series resistor 128 extending back to the input terminal 114.

The cascaded amplifiers 106, 108 constitute amplifying means connected with the input terminal 102, and adapted to have a limited response to voltages applied thereto. The non-inverting input terminal 130 includes a resistor 132 extending to ground. The inverting input 134 extends through resistors 136, 138 to a voltage divider consisting of resistors 141, 144 and potentiometer 147. The output of the amplifier 106 includes an isolation diode 146, which is within the feedback loop formed by resistor 148.

Resistors 150, 152 at the output of the amplifier 106 partially determine the span of the following amplifier stage 108. The latter includes input terminals 154, 156 and biasing resistors 158, 160 respectively. Negative feedback is provided from the output of the stage 108, including the coil 126 and the resistor 162. The operation of this embodiment is similar to that of the first two embodiments in that the amplifier 100 operates in a linear range and remains active over the entire range of input voltages or signals being applied across terminals 102 and 104. In contrast, the amplifier 106 is normally biased off until the input signal reaches a certain level, with the isolation diode 146 effectively disconnecting the amplifier 106 from the successive stage 108. For midrange measurements, the amplifier 106 contributes a positive incremental signal to the input 154 of the amplifier 108 which in turn drives the coil 126. High input signals saturate amplifier 106, thus eliminating subsequent incremental contributions therefrom.

When the coils 124, 126 in the feedback loops of the amplifiers 100, 108 respectively, there is minimized the tendency for the current through the coils to change with variations in temperature. That is, the current through the feedback loop from the output of each stage back to its own inverting input tends to remain constant regardless of the minute changes in the coil resistances. As a result, there is eliminated the need for thermistors providing temperature compensation. By this arrangement, the saturation characteristics of the amplifier 106 are employed to determine the upper end of the expanded scale region. In connection with this stage 106, a thermistor is provided, designated by the numeral 170, shunted by a resistance 172, in order to compensate for changes in the saturation output level of the amplifier 106 with temperature. Otherwise the operation of this embodiment is similar to that of FIG. 2.

Figure 4:
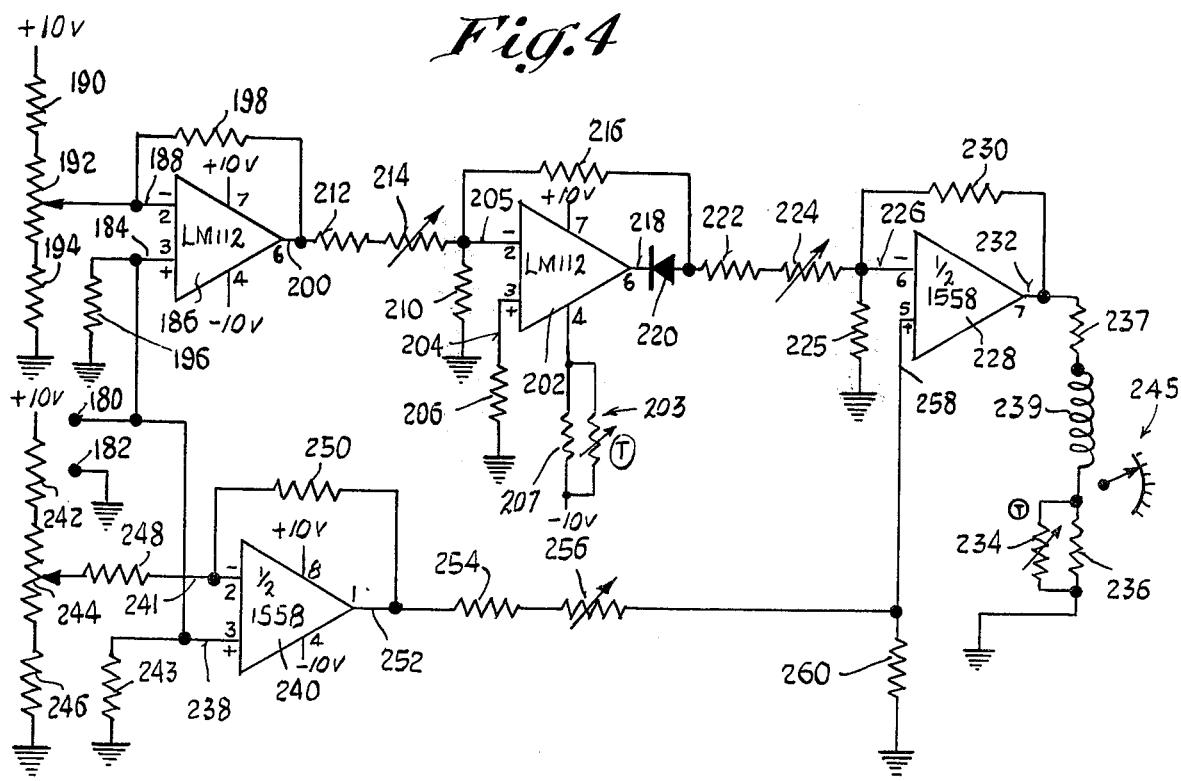
FIG. 4 is a schematic circuit diagram of still another embodiment of the invention, showing a scale expanding circuit including a summing amplifier, for driving a meter movement.

Another embodiment of the invention is illustrated in FIG. 4, showing a scale expanding circuit comprising input terminals 180, 182, one of which is connected to the input terminals of amplifying or branch circuit means including a driving amplifier 186 and a driven amplifier 202. The inverting input terminal 188 receives bias derived from a voltage divider comprising resistors 190, 194 and potentiometer 192. Resistor 196 connected to the non-inverting terminal extends to ground as shown. Resistor 198 provides negative feedback for the stage 186.

Connected to the output terminal 200 is the driven amplifier 202, having input terminals 204, 205, with corresponding resistors 206, 210, respectively extending therefrom to ground. Interposed between the amplifiers 186 and 202 are resistors 210–214 which together with the feedback resistor 216 establish the gain of the amplifier 202. Connected to the output 218 of the amplifier 202 is an isolation diode 220 which is shown disposed within the feedback loop. This diode normally conducts when the output on lead 218 of amplifier 202 is low, but opens when the output assumes a high positive state. In connection with this stage 202, a thermistor is provided, designated by the numeral 203, shunted by a resistance 207, in order to compensate for changes in the saturation output level of the amplifier 202 with temperature. Extending from the diode 220 are additional resistors 222, 224 which are in turn connected to the input or feeder terminal 226 of a summing amplifier 228. A resistor 225 extends from this point to ground. Feedback resistor 230 extends from the output 232 of the summing amplifier to the input 226, and together with the resistors 222 – 225 determines the gain of the stage. The latter in turn drives a meter or instrument movement with scale 245 through a current limiting resistor 237; a thermistor 234, together with shunt reistor 236 provide temperature compensation for the movement 245. The coil of the movement is designated by the numeral 239.

In addition, the input terminal 180 is connected to an input 238 of another branch circuit or amplifier 240, having an associated resistor 243 extending to ground. Bias for the amplifier 240 on terminal 241 is obtained from a voltage divider consisting of resistors 242 and 246 and potentiometer 244. An input resistor 248, together with a feedback resistor 250, establish the gain of the amplifier 240. The output terminal 252 extends through two additional resistors 254, 256 to the input or feeder terminal 258 of the amplifier 228. Resistor 260 forms a voltage divider with the resistors 254, 256. The summing amplifier 228 may be considered as a component of the electrical indicating device which includes the instrument movement 239 with scale 245 and the feeder terminals 226, 258 at the amplifier input.

In operation, it will be seen that an input signal or voltage applied to terminal 180 drives the amplifier 240 directly, which, in turn, results in a contribution to the reading of the meter 245 through the summing amplifier 228.

For input levels below that corresponding to the lower limit of the expanded scale, the amplifier 186 is normally biased off by the string 190–194. Under such circumstances, the amplifier 202 will assume a high (saturated) output voltage on line 218, thus reverse-biasing the isolation diode 220. As a result, there will be no incremental contribution to the summing amplifier received on line 226. As the input voltage begins to increase on terminal 180, gradually the amplifier 186 will begin to drive the amplifier 202, thus resulting in a decrease in the output signal on line 218, eventually causing conduction of the isolation diode 220. This in turn, provides a (negative going) drive signal to line 226 of the summing amplifier 228, which provides an additive contribution to the reading of the meter 245. Due to the fact that for a given excursion of input signal on terminal 180, the direction of the excursion on lines 258 and 226 is opposite, such excursions are summed in the amplifier 228, producing an additive signal on the output line thereof.

With further increases in the level of the input signal, the amplifier 202 will eventually be driven to a low output voltage on line 218. A point will be reached, due to the relatively high gain of the amplifiers 186 and 202, wherein further increases in the input voltage will result in no further decreases in the level of the signal on line 226 of the summing amplifier 228. Accordingly, beyond such an input level, contributions to the meter reading will be confined solely to those which are due to the amplifier 240, and return to unexpanded scale operation will consequently result.

By the above organization, during such time as the amplifier 202 is either biased off or saturated, no incremental contributions therefrom will be received at the coil 239. Accordingly, non-expanded scale operation will result. Expanded scale operation occurs when the amplifier 202 receives an input level (from amplifier 186) which causes neither cut-off nor saturation. Under such circumstances, excursions on terminal 180 give rise to incremental contributions to the ampifier 228 from both the amplifier 240 and the amplifier 202. In the appended claims, the cascaded amplifiers 186 and 202 are referred to as an amplifying means, whereas the amplifier 240 and associated resistors can be referred to as a signal processing network or a voltage responsive network.

Figure 5:
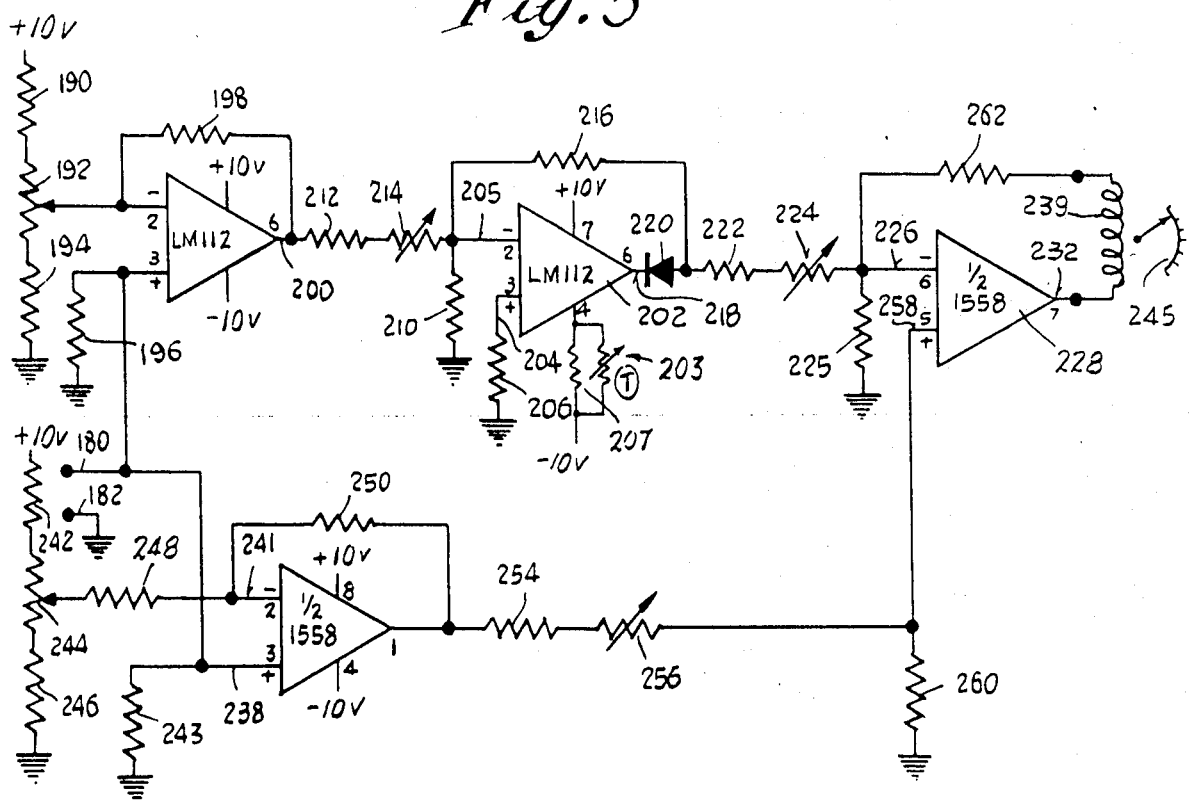
FIG. 5 is a schematic circuit diagram of yet another embodiment of the invention providing output terminal connections for a meter movement within the feedback loop of one of the amplifiers.

Another embodiment of the invention is illustrated in FIG. 5, showing a scale expanding circuit which is substantially the same as that illustrated in FIG. 4, with the exception that the connections to the meter 245 have been changed. In FIG. 5, extending from the output terminal 232 of the amplifier 228 is coil 239, having its other terminal connected to a fixed resistor 262, which in turn extends back to the inverting input terminal 226. By such an arrangement, the meter is part of the feedback network for the summing amplifier 228, which has the effect of compensating for changes in the coil resistance with temperature. With this organization, there is eliminated the need of the thermistor 234 in FIG. 4. In other respects, the operation of the circuit of FIG. 5 is similar to that of FIG. 4 and accordingly need not be repeated.

Figure 6:
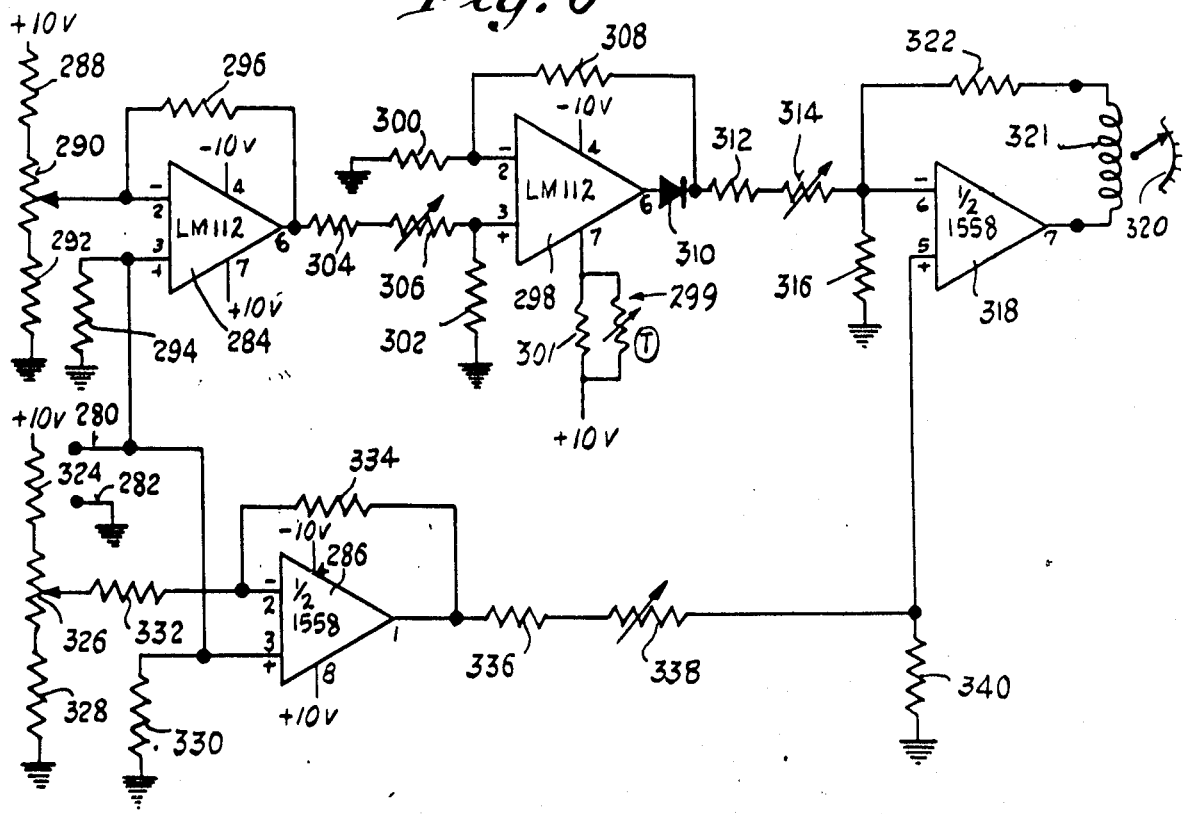
FIG. 6 is a schematic circuit diagram of still another embodiment of the invention, showing a scale compressing circuit similar to that of FIG. 5, for providing expanded scale readings at the ends or extremes of a particular scale on an indicator or meter.

Another embodiment of the invention is illustrated in FIG. 6 showing a scale adjusting circuit having input terminals 280, 282, the terminal 280 extending to the input terminals of amplifiers 284 and 286. Associated with the amplifier 284 are biasing resistors 288, 292, 294, potentiometer 290, and feedback resistor 296. The amplifier 284 is hereinafter referred to as a driving amplifier, and is followed by a driven amplifier 298 having biasing resistors 300, 302, and input resistors 304, 306. Resistor 308 provides negative feedback for the stage 298. Also, connected in the output of the latter is an isolation diode 310 which is disposed within the feedback loop. In connection with this stage 298, a thermistor is provided, designated by the numeral 299, shunted by a resistance 301, in order to compensate for changes in the saturation output level of the amplifier 298 with temperature. Connected with the diode are resistors 312, 314, which together with resistor 316 form a voltage divider for applying an input signal to a feeder terminal of a summing amplifier 318. The output of the latter drives a meter or instrument movement with scale 320 having a coil 321 which is in series with a fixed resistor 322, the meter forming part of the feedback circuit of the amplifier 318 as in the previous embodiment.

Associated with the amplifier 286 are biasing resistors 324, 328, and 330, potentiometer 326, input resistor 332, feedback resistor 334 and output resistors 336, 338. The latter extend to a divider resistor 340 and to the input or feeder terminal of the summing amplifier 318 as shown. The operation of this circuit is similar to that of FIG. 5, except that instead of providing an expanded scale at the center portion of the range of input signals being monitored, the circuit of FIG. 6 provides expanded scale readings at the lower and at the upper ends of the input voltage range being measured. This is accomplished in FIG. 6 by reversing the input leads on the amplifier 202 in FIG. 5, and reversing the connections on the isolation diode 310 from that of the diode 220. Otherwise, the connections to the amplifiers 284, 286 and 318 are generally the same. Due to the changes in polarity of the connections on the amplifier 298, the latter provides incremental contributions to the summing amplifier 318 which are in the same direction as those provided by the amplifier 286. For example, a positive excursion on line 280 will result in positive excursions on both inputs of the amplifier 318. Under such circumstances, these voltages are subtracted, since one of the inputs on the summing amplifier is an inverting input. Accordingly, during the time that the amplifier 298 is operating within its active (linear) range, the incremental contributions from the same are subtracted in the amplifier 318 from those received from the amplifier 286. As in the previous embodiment, for input signals or voltages near the low end or the high end of the input range being monitored, the amplifier 298 will be either biased off or driven into saturation, whereby incremental contributions therefrom will be negligible, and changes in the reading of the meter 320 will be confined solely to incremental contributions received from the (linear) amplifier 286.

From the above it can be seen that I have provided a novel and improved scale-expanding circuit for use with electrical indicators, the circuit being extremely simple in construction and reliable in operation, and involving no mechanical movable parts, gear trains, or complex feedback systems. Instead, simple amplifiers and resistance networks are employed throughout, with feedback being employed around the amplifiers, one at a time, thus contributing greatly to the simplicity and reliability of the circuit. Such devices can be readily constructed from parts which are available off the shelf. Performance of the unit over wide ranges of temperature is seen to be excellent, due to the provision of negative feedback around each amplifier, and to the provision of thermistor units to match the temperature coefficients of the coils of the indicator. The scale expanding circuit of the present invention is thus seen to represent a distinct advance and improvement in the technology of expanded scale indicator devices.

The above concepts and operation of the embodiments of the invention can be briefly summarized by the statement that two networks or branches are provided to receive monotonous incremental input voltages over a given range, and to contribute incremental voltage components to an instrument movement in a manner to produce full-scale instrument deflection when the input voltage is at its intended maximum value; one branch, however, being so constituted that its contribution is sometimes non-uniform or non-monotonous, this occurring whenever the input voltage is in a predetermined portion of the input voltage range.

Variations and modifications are possible without departing from the spirit of the invention.

I claim:

1. A circuit for use with an electrical indicating device to provide a scale-expanding or scale-compressing drive therefor, comprising in combination:

a. a pair of input terminals adapted to be connected to a source of input voltage which is to be measured and which varies over a predetermined input range, b. output terminals for connection to the indicating device, c. an electrical voltage responsive network interposed between one of said input terminals and one of said output terminals, said network normally providing, for the entire predetermined range of said input voltage, an incremental voltage contribution to said one output terminal in response to incremental input voltage excursions at the input terminals, and d. amplifying means including biasing means therefor, said amplifying means being connected with said input terminals and responding to voltages impressed thereon to provide to one of said output terminals a voltage contribution having a given characteristic incremental value for incremental voltages over one portion of the predetermined input range and a different characteristic incremental value for incremental voltages over another portion of the predetermined input range whereby a complete voltage excursion at the output terminals will manifest zones of different incremental characteristics when an input voltage having an excursion of monotonous incremental characteristic is applied at the input terminals, e. said amplifying means comprises a driving amplifier and a driven amplifier, connected in cascade, f. said driven amplifier having a feedback network connected between its output and its input, and g. an indicator having a field coil, h. said field coil constituting part of said feedback network.

2. A scale adjusting circuit as in claim 1, wherein:

a. said electrical network comprises an amplifier having an input connected to receive signals from one of said input terminals, and an output adapted to provide a driving voltage to one of said output terminals, b. said immediately preceding amplifier having a feedback network connected between its output and its input, c. said indicator having a second field coil, d. said second field coil constituting part of said immediately preceding amplifier feedback network.

3. A circuit for use with an electrical indicating device to provide a scale-expanding or scale-compressing drive therefor, comprising in combination:

a. a pair of input terminals adapted to be connected to a source of input voltage which is to be measured and which varies over a predetermined input range, b. feeder terminals, c. an electrical voltage responsive network branch interposed between one of said input terminals and one of said feeder terminals, said network normally providing, for the entire predetermined range of said input voltage, an incremental voltage contribution to said one feeder terminal in response to incremental input voltage excursions at the input terminals, d. a second voltage responsive branch comprising amplifying means including biasing means therefor, said amplifying means being connected with said input terminals and responding to voltages impressed thereon to provide to one of said feeder terminals a voltage contribution having a given characteristic incremental value for incremental voltages over one portion of the predetermined input range and a different characteristic incremental value for incremental voltages over another portion of the predetermined input range whereby a complete voltage excursion between two feeder terminals will manifest zones of different incremental characteristics when an input voltage having an excursion of monotonous incremental characteristic is applied at the input terminals, and e. a multi-input summing amplifier connected to said feeder terminals to receive voltage therefrom, f. said amplifying means comprising a driving amplifier and a driven amplifier, connected in cascade, g. said summing amplifier having a feedback network connected between its output and an input, and h. an indicator having a field coil, connected to and receiving voltage from said summing amplifier, said field coil of the indicator constituting part of said feedback network.

4. Expanded or compressed scale electrical instrumentation comprising, in combination:

a. a pair of input terminals for connection to a source of incremental input voltage which is to be measured and which can vary over a predetermined range from a preselected low value at the bottom of the range to a preselected high value at the top of the range, b. an electrical indicating device including feeder terminals and a feeder-terminal-connected instrument movement with a scale showing voltage values starting with a low value at the bottom of the scale and ending with a higher value at the top of the scale corresponding to full-scale deflection, c. an electrical voltage responsive network branch interposed between one of said input terminals and one of the feeder terminals for supplying a voltage to said one feeder terminal which is related to the input voltage from the source being measured, d. said network branch normally providing, for the entire predetermined range of said input voltage, an incremental voltage excursion contribution to said one feeder terminal in response to an incremental input voltage excursion at the input terminals starting from the bottom of the input voltage range and ending at the top of the range, e. a second branch comprising saturable amplifying means connected with said input terminals, responding to the voltages impressed thereon and providing a driving voltage to one of said feeder terminals, said amplifier means saturating when the input voltage is at some intermediate value between the said selected low and high values of its range, f. a negative feedback circuit for said amplifying means, g. means biasing said amplifying means to control its response, h. said amplifying means supplying to one of said feeder terminals a non-monotonous voltage contribution which, in conjunction with said voltage contribution from the said network branch, effects a full-scale deflection of the instrument movement when the input voltage is at its highest value in said predetermined input range, said non-monotonous voltage contribution having a given incremental characteristic for input voltage excursions over one portion of the predetermined input range, and having a substantially different given incremental characteristics for input voltage excursions over another portion of the predetermined input voltage range whereby the occurrence of a complete, full-range voltage excursion of monotonous characteristic at said input terminals will result in instrument movement deflections defining zones at the instrument movement scale which have substantially different incremental characteristics from each other and which are representative of a scale with expanded or compressed areas.

5. Instrumentation as in claim 4, wherein:
   a. said biasing means comprises a voltage divider connected to an input of the amplifying means, including adjustable means for varying the amplitude of said bias.

6. Instrumentation as in claim 4, wherein:
   a. the instrument movement has two field coils,
   b. one of said coils being connected to said electrical network branch through one feeder terminal,
   c. the other of said coils being connected to the output of said amplifying means through another feeder terminal,
   d. the voltage contributions to said coils from the network branch and from the amplifying means being additive.

7. Instrumentation as in claim 4, wherein:
   a. said electrical network branch comprises an amplifier having negative feedback, an input connected to receive voltage from one of said input terminals, and an output adapted to provide a driving voltage to the feeder terminal connected to the network branch.

8. Instrumentation as in claim 4, and further including:
   a. means in the output circuit of the amplifying means for isolating the associated feeder terminal from the amplifying means when the latter reaches a predetermined voltage.

9. Instrumentation as in claim 4, wherein:
   a. said amplifying means comprises a driving amplifier and a driven amplifier, connected in cascade, and
   b. means in the output circuit of the driving amplifier for isolating the latter from the driven amplifier when the driving amplifier output reaches a predetermined voltage.

10. Instrumentation as in claim 4, wherein:
    a. the electrical indicating device includes a summing amplifier connected with the feeder terminals and with said instrument movement for supplying voltages to the latter which are related to the input voltages,
    b. said amplifying means providing a driving voltage to said summing amplifier.

11. Instrumentation as in claim 10, wherein:
    a. said amplifying means comprises a driving amplifier and a driven amplifier, the latter being connected to the summing amplifier, and
    b. means in the output circuit of the driven amplifier for isolating it from the summing amplifier when the driven amplifier output exceeds a predetermined voltage.

12. Instrumentation as in claim 4, wherein:
    a. the instrument movement has two field coils,
    b. one of said coils being connected to a feeder terminal that is connected to said electrical network branch,
    c. the other of said coils being connected to a feeder terminal that is connected to the output of said amplifying means,
    d. the contributions to said coils from the network branch and from the amplifying means being subtractive.

13. Expanded or compressed scale electrical instrumentation comprising, in combination:
    a. a pair of input terminals for connection to a source of incremental input voltage which is to be measured and which can vary over a predetermined range from a low value at the bottom of the range to a high value at the top of the range,
    b. an electrical indicating device including feeder terminals and a feeder-terminal-connected instrument movement with scale showing voltage values starting with a low value at the bottom of the scale and ending with a higher value at the top of the scale corresponding to full-scale deflection,
    c. an electrical network branch interposed between one input terminal and one feeder terminal,
    d. said network branch normally providing, for the entire predetermined range of said input voltage, an incremental voltage excursion contribution to said one feeder terminal in response to an incremental input voltage excursion at the input terminals starting from the bottom of the input voltage range and ending at the top of the range, and
    e. a second branch, comprising means connected with said one input terminal and with a feeder terminal, supplying to the latter a non-monotonous voltage contribution which, in conjunction with said voltage contribution from the said network branch, effects a full-scale deflection of the instrument movement when the input voltage is at its highest value in said predetermined input range, said non-monotonous voltage contribution having a given incremental characteristic for input voltage excursions over one portion of the predetermined input range, and having a substantially different given incremental characteristic for input voltage excursions over another portion of the predetermined input voltage range whereby the occurrence of a complete, full-range voltage excursion of monotonous characteristic as said input terminals will result in instrument movement deflections defining zones at the instrument movement scale which have substantially different incremental characteristics from each other and which are representative of a scale with expanded or compressed areas,
    f. said electrical indicating device including a summing amplifier having its input connected to said feeder terminals,
    g. said summing amplifier having a negative feedback circuit,
    h. said instrument movement having a coil constituting part of said negative feedback circuit.

14. Expanded or compressed scale electrical instrumentation comprising, in combination:
    a. a pair of input terminals for connection to a source of incremental input voltage which is to be measured and which can vary over a predetermined range from a low value at the bottom of the range to a high value at the top of the range, b. an electrical indicating device including feeder terminals and a feeder-terminal-connected instrument movement with scale showing voltage values starting with a low value at the bottom of the scale and ending with a higher value at the top of the scale corresponding to full-scale deflection, c. an electrical network branch interposed between one input terminal and one feeder terminal, d. said network branch normally providing, for the entire predetermined range of said input voltage, an incremental voltage excursion contribution to said one feeder terminal in response to an incremental input voltage excursion at the input terminals starting from the bottom of the input voltage range and ending at the top of the range, and e. a second branch, comprising means connected with said one input terminal and with a feeder terminal, supplying to the latter a non-monotonous voltage contribution which, in conjunction with said voltage contribution from the said network branch, effects a full-scale deflection of the instrument movement when the input voltage is at it highest value in said predetermined input range, said non-monotonous voltage contribution having a given incremental characteristic for input voltage excursions over one portion of the predetermined input range, and having a substantially different given incremental characteristic for input voltage excursions over another portion of the predetermined input voltage range whereby the occurrence of a complete, full-range voltage excursion of monotonous characteristic at said input terminals will result in instrument movement deflections defining zones at the instrument movement scale which have substantially different incremental characteristics from each other and which are representative of a scale with expanded or compressed areas, f. said voltage responsive network branch including an amplifier having a negative feedback circuit, g. said instrument movement having a coil constituting part of said negative feedback circuit.

15. Expanded or compressed scale electrical instrumentation comprising, in combination:

a. a pair of input terminals for connection to a source of incremental input voltage which is to be measured and which can vary over a predetermined range from a low value at the bottom of the range to a high value at the top of the range, b. an electrical indicating device including feeder terminals and a feeder-terminal-connected instrument movement with scale showing voltage values starting with a low value at the bottom of the scale and ending with a higher value at the top of the scale corresponding to full-scale deflection, c. an electrical network branch interposed between one input terminal and one feeder terminal, d. said network branch normally providing, for the entire predetermined range of said input voltage, an incremental voltage excursion contribution to said one feeder terminal in response to an incremental input voltage excursion at the input terminals starting from the bottom of the input voltage range and ending at the top of the range, and e. a second branch, comprising means connected with said one input terminal and with a feeder terminal, supplying to the latter a non-monotonous voltage contribution which, in conjunction with said voltage contribution from the said network branch, effects a full-scale deflection of the instrument movement when the input voltage is at its highest value in said predetermined input range, said non-monotonous voltage contribution having a given incremental characteristic for input voltage excursions over one portion of the predetermined input range, and having a substantially different given incremental characteristic for input voltage excursions over another portion of the predetermined input voltage range whereby the occurrence of a complete, full-range voltage excursion of monotonous characteristic at said input terminals will result in instrument movement deflections defining zones at the instrument movement scale which have substantially different incremental characteristics from each other and which are reperesentative of a scale with expanded or compressed areas.

f. said second branch including an amplifier having a negative feedback circuit, g. said instrument movement having a coil constituting part of said negative feedback circuit.

* * * * *